United States Patent
Laika

(10) Patent No.: US 11,187,744 B2
(45) Date of Patent: Nov. 30, 2021

(54) MEASURING DEVICE AND MEASURING METHOD USING ITERATIVE TRACE-BASED SIGNAL ANALYSIS

(71) Applicant: Rohde & Schwarz GmbH & Co. KG, Munich (DE)

(72) Inventor: Andreas Laika, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 599 days.

(21) Appl. No.: 16/182,702

(22) Filed: Nov. 7, 2018

(65) Prior Publication Data

US 2020/0141997 A1    May 7, 2020

(51) Int. Cl.
*G01R 31/28* (2006.01)

(52) U.S. Cl.
CPC ................................ *G01R 31/2837* (2013.01)

(58) Field of Classification Search
CPC ..... G01R 31/2837; G01R 23/16; G01R 23/15
See application file for complete search history.

(56) References Cited

U.S. PATENT DOCUMENTS

| | | | | |
|---|---|---|---|---|
| 3,786,351 A * | 1/1974 | Priebe, Jr. | ............. | G01R 23/18 324/76.23 |
| 5,101,506 A * | 3/1992 | Walls | ....................... | H03C 3/40 327/105 |
| 5,262,957 A * | 11/1993 | Hearn | ..................... | G01R 23/16 324/76.19 |
| 5,455,547 A * | 10/1995 | Lin | ..................... | H03H 9/02275 333/186 |
| 5,548,197 A * | 8/1996 | Unsworth | ................. | G01P 3/48 318/729 |
| 8,872,504 B2 * | 10/2014 | Suryan | .................... | G01R 23/16 324/76.29 |
| 9,858,240 B2 | 1/2018 | Dees et al. | | |
| 10,873,868 B2 * | 12/2020 | Thraenhardt | .......... | G01R 21/01 |
| 2003/0198304 A1 * | 10/2003 | Sugar | ................. | G01R 13/0254 375/340 |
| 2004/0137915 A1 * | 7/2004 | Diener | .................. | H04W 24/00 455/456.1 |
| 2004/0263408 A1 * | 12/2004 | Sievenpiper | ............. | H01Q 3/46 343/757 |
| 2005/0227625 A1 * | 10/2005 | Diener | ................... | H04B 17/26 455/67.7 |

(Continued)

*Primary Examiner* — Manuel A Rivera Vargas
*Assistant Examiner* — Yaritza H Perez Bermudez
(74) *Attorney, Agent, or Firm* — Potomac Technology Law, LLC

(57) ABSTRACT

A measuring device for measuring a signal of interest within a measuring signal is provided. It device comprises a trace determiner, which is adapted to consecutively determine a first stack of traces of the measuring signal, a statistics evaluator, adapted to, after each trace of said first stack of traces is determined by the trace determiner, statistically evaluate if a presence of the signal of interest is detected with a first pre-set degree of certainty, wherein the trace determiner is adapted to cease determining said traces of said first stack of traces, when the statistics evaluator has determined that the signal of interest has been detected to the first pre-set degree of certainty. Preferably a parameter determiner is, adapted to determine measuring parameters, based upon the statistical evaluation.

18 Claims, 2 Drawing Sheets

(56) References Cited

U.S. PATENT DOCUMENTS

| | | | |
|---|---|---|---|
| 2006/0038677 A1* | 2/2006 | Diener | H04W 12/122 |
| | | | 340/540 |
| 2008/0019464 A1 | 1/2008 | Kloper et al. | |
| 2009/0310661 A1* | 12/2009 | Kloper | H04B 17/318 |
| | | | 375/224 |
| 2011/0150062 A1* | 6/2011 | Inadomaru | G01R 23/173 |
| | | | 375/224 |
| 2012/0306886 A1* | 12/2012 | Bernard | G01R 13/0254 |
| | | | 345/440.1 |
| 2014/0240605 A1* | 8/2014 | Basawapatna | G01R 23/165 |
| | | | 348/725 |
| 2020/0200794 A1* | 6/2020 | Niles | G01R 13/0218 |
| 2021/0012171 A1* | 1/2021 | Druffel | G06K 19/0672 |

* cited by examiner

MEASURING DEVICE AND MEASURING METHOD USING ITERATIVE TRACE-BASED SIGNAL ANALYSIS

TECHNICAL FIELD

The invention relates to a measuring device, especially to a spectrum analyzer and an according measuring method.

BACKGROUND

A conventional spectrum analyzer is for example shown in US 2008/0019464 A1. In order to analyze signals by a spectrum analyzer automatically, a preliminary analysis of the signal may be performed. For performing such a preliminary analysis, expensive separate hardware may be used. Alternatively, regular capturing means within the spectrum analyzer can be used. This leads to a very long analysis time though.

Accordingly, there is a need to provide a measuring device and a measuring method, which allow for automatically analyzing a measuring signal without requiring expensive hardware and without requiring a long measuring time.

Some Example Embodiments

Embodiments of the present invention advantageously address the foregoing requirements and needs, as well as others, by providing a measuring device and a measuring method that uses iterative trace-based signal analysis, which allow for automatically analyzing a measuring signal without requiring expensive hardware and without requiring a long measuring time.

According to a first aspect of the invention, a measuring device for measuring a signal of interest within a measuring signal is provided. The measuring device comprises a trace determiner, which is adapted to consecutively determine a first stack of traces of the measuring signal, a statistics evaluator, adapted to, after each trace of said first stack of traces is determined by the trace determiner, statistically evaluate if a presence of the signal of interest is detected with a first pre-set degree of certainty, wherein the trace determiner is adapted to cease determining said traces of said first stack of traces, when the statistics evaluator has determined that the signal of interest has been detected to the first pre-set degree of certainty. Preferably there is a parameter determiner, adapted to determine measuring parameters, based upon the statistical evaluation. By use of this iterative approach, it is possible to significantly reduce the measuring time without requiring expensive additional hardware.

Preferably, the measuring device comprises a receiver, adapted to measure the signal of interest within the measuring signal, based upon the parameters determined by the parameter determiner. This allows for a very accurate measurement.

Further advantageously and preferably, the parameter determiner is adapted to determine said measuring parameters based upon said degree of certainty, by which the presence of the signal of interest is determined by the statistics evaluator. This allows for a very accurate measurement.

Preferably, the measuring parameters comprise a center frequency, and/or a frequency span and/or an amplitude and/or a power of the signal of interest. This allows for a very accurate measurement.

Further advantageously and preferably, the statistics evaluator is adapted to perform statistical evaluation by detecting signals statistically significant with regard to a noise floor. This also increases measuring accuracy.

Further advantageously and preferably, the statistics evaluator is adapted so that the statistical evaluation comprises determining signal of interest candidates as individual frequency bin values of a single trace of the first stack of traces exceeding at least one pre-set noise threshold. This allows for a very accurate measurement.

Preferably, the statistics evaluator is adapted so that the statistical evaluation comprises determining signal of interest candidate sets as sets of frequency bin values of a same frequency over a plurality of consecutive traces, exceeding a pre-set noise threshold. This further increases the accuracy of determining the signal of interest.

Further advantageously and preferably, the statistics evaluator is adapted so that the statistical evaluation comprises determining a frequency of occurrence of the signal of interest candidate sets. This allows for determining a periodicity of the signal of interest.

Further advantageously and preferably, the statistics evaluator is adapted to determine if the signal of interest is pulsed. This allows for a very flexible automatic measurement.

Advantageously and preferably, the statistics evaluator is adapted so that said determining if the signal of interest is pulsed, comprises determining how often the signal of interest occurs within said stack of traces. This allows for a very accurate determining of the repetitive nature of the signal of interest.

Advantageously and preferably, after the statistics evaluator has determined that the signal of interest has been detected to the pre-set degree of certainty, the trace determiner is adapted to determine a second stack of traces, wherein a span of the second stack of traces is a pre-set bandwidth around a span of the signal of interest determined by the statistics evaluator.

The statistics evaluator is further preferably adapted to, after each trace of said second stack of traces is determined by the trace determiner, statistically evaluate if a presence of the signal of interest is detected within a second pre-set degree of certainty, wherein the trace determiner is adapted to seize determining said traces of said second stack of traces, when the statistics evaluator has determined that the signal of interest has been detected to the second pre-set degree of certainty.

Preferably the parameter determiner is adapted to determine the measuring parameters based upon the statistical evaluation of the first stack of traces and the second stack of traces. This allows for an especially accurate determining of the signal of interest.

Preferably, the statistical evaluator is adapted to determine a referenced noise level, a peak level of the determined signal of interest, and a noise threshold between the referenced noise level and the peak level of the determined signal of interest. The statistical evaluator is further adapted to perform the statistical analysis based upon said noise threshold. This allows for an especially accurate analysis.

Preferably, the statistical evaluator is adapted to determine a repetition interval of the signal of interest from a time of the signal above the noise threshold and a time of the signal below the noise threshold. This allows for an especially accurate determining of the periodicity of the signal of interest.

Advantageously and preferably, the measuring device is adapted to suggest at least one type of measurement based upon the statistic evaluation by the statistical evaluator using a display. This allows for a reduction of the necessary user competence.

According to a second aspect of the invention, a measuring method for measuring a signal of interest within a measuring signal is provided. The method comprises consecutively determining a first stack of traces of the measuring signal, after each trace of said first stack of traces is determined, and statistically evaluating if a presence of the signal of interest is detected with a first pre-set degree of certainty, ceasing determining said traces of said first stack of traces, when it has been determined that the signal of interest has been detected to the first pre-set degree of certainty.

Preferably determining measuring parameters based upon the statistical evaluation is made. By use of this iterative approach, it is possible to significantly reduce the measuring time without requiring expensive additional hardware.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Exemplary embodiments of the invention are now further explained by way of example only with respect to the drawings, in which.

DETAILED DESCRIPTION

A measuring device and a measuring method that uses iterative trace-based signal analysis, which allow for automatically analyzing a measuring signal without requiring expensive hardware and without requiring a long measuring time, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

A processor, unit, module or component (as referred to herein) may be composed of software component(s), which are stored in a memory or other computer-readable storage medium, and executed by one or more processors or CPUs of the respective devices. A module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in a computer memory store.

Figure 1:
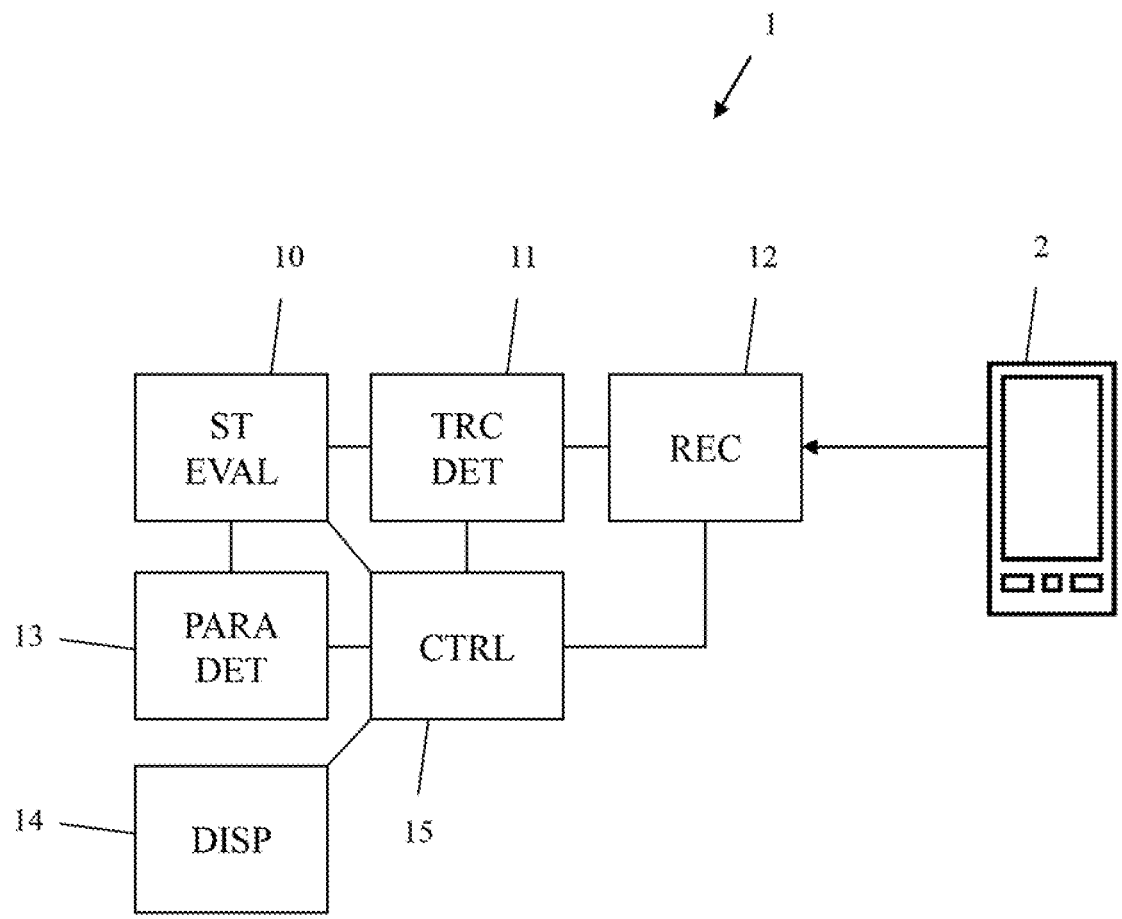
FIG. 1 shows an embodiment of the inventive measuring device according to the first aspect of the invention.

First, we demonstrate the construction and function of a first embodiment of the inventive measuring device according to the first aspect of the invention along FIG. 1. Finally, with regard to FIG. 2, the detailed function of an embodiment of the inventive measuring method according to the second aspect of the invention is described along FIG. 2. Similar entities and reference numbers in different figures have been partially omitted.

Reference will now be made in detail to the preferred embodiments of the present invention, examples of which are illustrated in the accompanying drawings. However, the following embodiments of the present invention may be variously modified and the range of the present invention is not limited by the following embodiments.

First Embodiment

The objective is to primarily detect whether the signal of interest is present in the measuring signal or not. Additionally, it can be a goal to determine, if the signal of interest is pulsed or unpulsed and to adapt an attenuation according to the power level of the signal.

These tasks are interlinked. As an example, the measurement has usually starts with a strong attenuation, in case a strong signal is present, which else may damage the measuring device. But these settings also mask weaker signals. Similarly pulsed signals may be missed in short sweeps, and misinterpreted as a signal missing. Thus it is preferable to estimate all parameters combined, rather than one after the other.

In FIG. 1, an embodiment of the inventive measuring device 1 according to the first aspect of the invention is shown. The measuring device 1 is connected to a device under test 2. The measuring device 1 serves the purpose of determining and measuring a signal of interest within a measuring signal. The signal of interest is the signal generated by the device under test 2. The measuring signal is the entire signal received by the measuring device 1, including the signal of interest and a noise floor.

The measuring device 1 comprises a statistics evaluator 10, a trace determiner 11, a receiver 12, a parameter determiner 13, a display 14 and a controller 15. All components 10-14 are connected to the controller 15. Additionally, the statistics evaluator 10 is connected to the parameter determiner 13 and to the trace determiner 11. The trace determiner 11 is additionally connected to the receiver 12. The components 10-14 are preferably controlled by the controller 15. This is not mentioned every single time, the function of one of the elements 10-14 is mentioned. It should be noted though, that each of the functions performed by the components 10-14 is than initiated by the controller 15.

It is important to note that the receiver 12 and the display 14 are optional components. Also, it should be noted that the controller 15 is an optional component. In case the controller 15 is not present, the components 10-14 operate independently and coordinate between themselves.

In the embodiment depicted here, the measuring signal is received by the receiver 12 and brought into a form, in which it can be analyzed by the trace determiner 11. E.g. the receiver 12 reduces the frequency of the measuring signal and digitizes it. In case the receiver 12 is not present within the measuring device 1, its functions are performed by the trace determiner 11 which then consecutively determines a first stack of traces of the measuring signal. Stack therein means a series of traces, time-wise one after the other with identical measuring parameters, such as center frequency and span. Traces within the same stack also have the same attenuation. If in subsequent processing, though the attenuation seems inadequate, the whole stack is dropped and the measurement starts with a more fitting attenuation.

After each one of the traces of the first set of traces is determined, it is handed to the statistics evaluator 10, which performs a statistical evaluation of the respective trace in parallel to the trace determiner already determining the next trace. Especially, it is determined, if a signal of interest is present within the respectively analyzed trace. Also, a degree of certainty, with which the signal of interest has been detected, is determined.

The trace determiner 11 consecutively determined traces, which are then each analyzed by the statistics evaluator 10, as they are determined. As soon as the statistics evaluator has determined the presence of the signal of interest with at least the first degree of certainty, the trace determiner 11 ceases determining further traces of the first stack of traces. The results of the statistical analysis are then handed to the parameter determiner 13 by the statistics evaluator 10, which determines measuring parameters based thereupon. Especially, the parameter determiner 13 determines measuring parameters such as the center frequency, the span, the amplitude and/or the power level of the signal of interest.

This information may then be used by the receiver 12, for performing a measurement of the signal of interest. Measuring results are then handed to the controller 15, which can display them on the display 14.

Advantageously, the measuring device is adapted to determine one or more advised measurements to be performed based upon the measuring parameters determined by the parameter determiner 13. These advised measurements are then displayed on the display 14, for selection by a user.

For some types of measurements predefined standards exist for different standardized signals. One example is the Adjacent Channel Power (ACP) or Adjacent Channel Leakage Ratio (ACLR) measurement. Another example is the Spectrum emission mask (SEM) measurement.

Both of these measurements provide multiple predefined measurements for standards such as GSM, LTE CDMA, WLAN. Thus a complete list of all measurements for all standards can become quite lengthy. With the estimated span of the signal, it is now possible to compute the delta to the reference bandwidth in the standard, and to then present a sorted list prioritized according to the lowest difference of estimated span and reference bandwidth.

Example: Below a list of standards and the bandwidths associated with them is provided. These standards are presented sorted lexicographically, or sorted according to bandwidth. Let's say there is a WIMAX signal present. Then in both cases, the signal would be somewhere at the end of the list and for a longer list some searching is involved.

| | |
|---|---|
| CDMA2000 | 1228800 Hz |
| GSM | 200000 Hz |
| LTE | 9015000 Hz |
| TETRA | 24300 Hz |
| W-CDMA | 3840000 Hz |
| WIMAX | 7000000 Hz |
| WLAN | 22000000 Hz |

When the process is applied and the list is sorted according to difference of estimated span and reference bandwidth, the WIMAX standard is now on top of the list, and can easier be selected by the user. See the sorted list below:

| | |
|---|---|
| WIMAX | 7000000 Hz |
| LTE | 9015000 Hz |
| W-CDMA | 3840000 Hz |
| CDMA2000 | 1228800 Hz |
| GSM | 200000 Hz |
| TETRA | 24300 Hz |
| WLAN | 22000000 Hz |

The advantage here is that the best matching algorithm is presented, but that in case of a mismatch, also no standard is excluded, and thus the user is not misguided.

Especially, the parameter determiner 13 can determine the measuring parameters based upon said degree of certainty, by which the presence of the signal of interest is determined by the statistics evaluator.

Also, the statistics evaluator 10 may be adapted to perform the statistical evaluation by detecting signals, statistically significant with regard to the noise floor within the measuring signal. This noise floor may also be determined by the statistics evaluator 10.

Moreover, the statistics evaluator may determine signal of interest candidates within each trace of the first stack of traces. Such an individual signal of interest candidate in this example is a frequency bin value of the trace, which exceeds at least one pre-set noise threshold. Also, the statistics evaluator can determine signal of interest candidate sets as sets of frequency bin values of a same frequency over a plurality of consecutive traces, exceeding the pre-set noise threshold. These candidates can then be used for determining the signal of interest.

Also, the statistics evaluator 10 may be adapted to determine a periodicity of the signal of interest. To do so, a frequency of occurrence of the signal of interest within the candidate sets is determined.

Especially, in order to increase the measuring accuracy, after the signal of interest has been determined based upon the first stack of traces, the trace determiner 11 may be adapted to consecutively determine a second stack of traces. The span of the second stack of traces is a pre-set bandwidth around a span of the signal of interest determined by the statistics evaluator. The statistics evaluator 10 then statistically evaluates again, if the signal of interest is determined within each individual trace of the second stack of traces to a second degree of certainty. As soon as this is the case, the trace determiner 11 again ceases determining the stacks of the second stack of traces. The parameter determiner 13 determines the measuring parameters not only based upon the statistical analysis of the first stack of traces but also based upon the second stack of traces.

In order to further increase the accuracy, the statistics evaluator determines a noise level, and a peak level of the determined signal of interest. Therefrom the statistics evaluator 10 determines a noise threshold. The statistical evaluation is based upon this noise threshold.

Furthermore, the periodicity of the signal can be determined based upon this noise threshold by comparing times of the signal of interest above the noise threshold and times of the signal of interest below the noise threshold.

In the following, some more details of the statistical evaluation are given, which are relevant to the first aspect of the invention, as described above, but also with regard to the second aspect of the invention described later:

Stage 1:
Step A1: Note: These steps may be performed by the trace determiner 11.
  Initialize/adapt settings for attenuation, sweep time, initial center frequency and initial span (full span preferably) of the device. The sweep time is set to the lowest possible value to speed up the process.
  Acquire a first set of $L_t$ traces (typically $L_t$=3-5) and add the trace data to a trace stack. Each trace consists of Nf trace points showing the spectral content of signal amplitude start to against frequency in the range from start frequency $f_{start}$ to stop frequency $f_{stop}$
  Note: A "stack of traces" is a set of subsequently acquired traces, with identical measurement settings. I.e. the measurement is performed in the same frequency band (same start and stop frequency). The same measurement time and resolution bandwidth are used.
  Note: Often instead of start frequency and stop frequency, center frequency $f_{cent}$ and span $f_{span}$ are used instead which relate to each other like this:

$$f_{cent}=(f_{stop}+f_{start})/2 \; f_{span}=(f_{stop}-f_{start})$$

Step B1:
Process trace stack for results:
  For each trace of the first stack of traces normalize the trace to the modified z-score (see later described Routine 1) and find signal candidates based on that score
  Find the signal candidate with the overall highest modified z-score, cluster (see later described Routine 2) all adjacent signal candidates into a list of significance candidates.
  For each frequency in the trace stack count the number of signal candidates, determine the maximal occurrence Locc of signal candidates for a given frequency point and create a list of all frequency points having that maximal occurrence. That list is denoted maximal occurrence candidates.
Evaluate the results:
  For all trace points in the first stack of traces, determine the maximal value. If that value is below a predefined threshold:
    Adapt the attenuation, reset the trace stack and restart Step A1
  If the maximal occurrence is smaller than a defined threshold, e.g. smaller than 2:
    Go back to Step A1 and continue acquiring traces—
    Note: This may be done to avoid sporadic detections
  If there is an overlap of maximal occurrence candidates and significance candidates
    Determine the center frequency and span of that overlapping region, finish Step B1 and use the center frequency and span as a result for subsequent processing.
  Finish Step B1. If maximal occurrence equals the size of the trace stack, label the signal as unpulsed, otherwise as pulsed.
  If there is no overlap of maximal occurrence candidates and significance candidates, but the maximal occurrence is large enough, preferably at least larger than the initial trace stack size, i.e. $L_{occ}>L_t$
    Finish Step B1. Label the signal as pulsed.
  If the maximum defined size of the trace stack Lmax is reached:
    Finish Step B1. Report that no signal has been detected.
  Else, continue with Step A1.
Stage 2:
Step A2:
  Iterate over the original first stack of traces, for each frequency determine the maximum value, and aggregate these in a maximum trace.
  Use the maximum trace as the current trace for processing in Step B2.
Step B2:
  In a simplified version, apply the above process to a single trace:
    Compute the signal candidates for the current trace (see Routine 1) and cluster them as in Routine 2
    Determine the center frequency and span of the significance candidates
Step B3:
  For an unpulsed detection keep the sweeptime short.
  For a pulsed detection adapt the device's settings to a longer sweeptime, ensuring that the pulsed signal may be detected
Step B4:
Repeat the steps below until abortion criteria has been reached:
  Set the center frequency of the device to the previously estimated center frequency, and the span of the device to a multiple (typically 3-5) of the previously estimated span
  Acquire a trace of a second stack of traces
  Compute the signal candidates for the current trace (see Routine 1) and cluster them as in Routine 2
  Determine the center frequency and span of the significance candidates
Abortion criteria:
  The difference in estimated spans is below a predefined threshold.
  The max number of iterations has been reached.
Routine 1: Modified z-score and determination of "signal candidates" within a given trace: ("detect_outlier")
  Note: a trace consists of $N_f$ trace points show the spectral content of signal amplitude against frequency in the range from start frequency $f_{start}$ to stop frequency $f_{stop}$.
  The statistical distribution of a trace without a signal is assumed to follow a distinct statistical distribution. A precise description would be the log raigley distribution, for mathematical simplicity however a normal distribution is assumed here.
  To determine "signal candidates" outliers to this chosen statistical distribution are identified. This is done by performing Grubbs' test.
  Grubbs' test normalizes the presented data (in this case the trace data) by subtracting the estimated mean value and from each data value and then dividing it by the estimated standard deviation. The resulting values are then compared with a threshold, which only depends on the significance level and the number of samples in a trace and can thus be precomputed. As a modification in the presented case the trace data is normalized by subtracting the estimated median value (instead of the mean) and from each data value and then dividing it by the estimated median absolute deviation (MAD) (instead of the estimated standard deviation).

$$MAD=\text{median}(|Y_i-\hat{Y}|) \text{ with } \hat{Y}=\text{median}(\hat{Y})$$

This normalization is called modified z-score.

In summary, trace data is first transformed with the modified z-score, which describes the level of significance of a point being an outlier to the noise distribution. The resulting values are then compared with a precomputed threshold to determine "signal candidates".

Routine 2: Clustering of "signal candidates": ("ClusterOutlierC")—Purpose: Only consider groups of "signal candidates", rather than each signal candidate individually. Perform the following steps:

Identify a seed point, by selecting the signal candidate with the largest modified z-score.

Define a seed range of $N_{seed}$ trace-points around the seedpoint. Add all signal candidates within the seed range to a first list of significance candidates.

Perform the following steps until no more new significance candidates are found:

Define a new search range by extending the frequency range of the existing significance candidates by a predefined search factor (e.g. 50%).

Add signal candidates within that search range to the list of significance candidates.

Repeat until no more new significance candidates are found.

Second Embodiment

Figure 2:
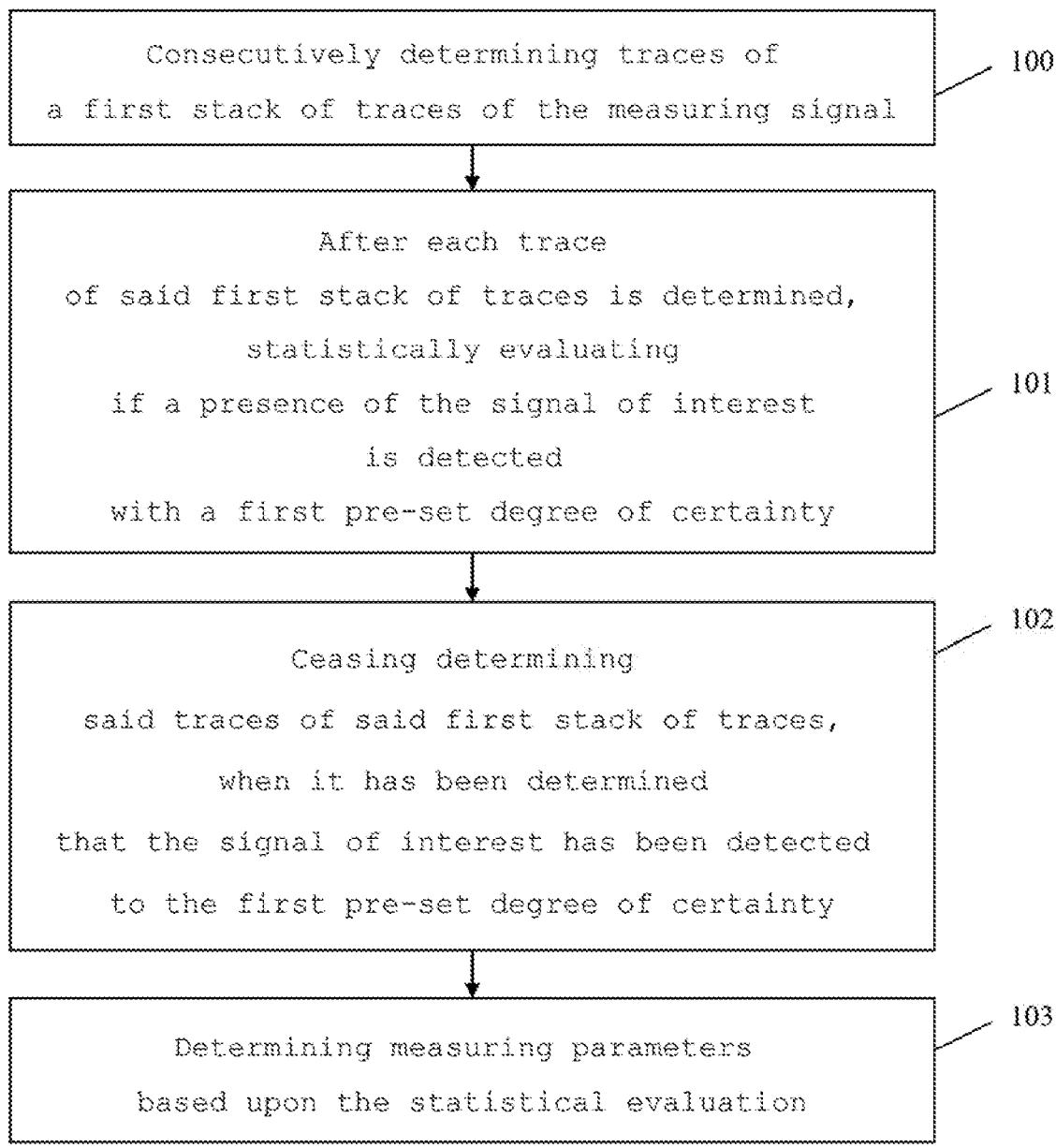
FIG. 2 shows an embodiment of the inventive measuring method according to the second aspect of the invention in a flow diagram.

In FIG. 2, an embodiment of the inventive measuring method is shown in a flow diagram. In a first step 100, traces of a first stack of traces of the measuring signal are determined consecutively. In a second step 101, after each trace of said first stack of traces is determined, it is evaluated statistically, if a presence of the signal of interest is detected with a first pre-set degree of certainty. In a third step 102, the determining of the traces of said first stack of traces is seized, when it has been determined that the signal of interest has been detected to the first pre-set degree of certainty. In a final fourth step 103, measuring parameters are determined based upon the statistical evaluation.

It should be noted that the first aspect and the second aspect of the invention very closely correspond to each other. Therefore, all features of the device are also relevant to the method and vice-versa.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate data with the processor through a variety of known means.

The invention is not limited to the examples and especially not to specific signal types or devices under test. The invention discussed above can be applied to a plurality of measuring devices and devices under test.

Although the present invention and its advantages have been described in detail, it should be understood, that various changes, substitutions and alterations can be made herein without departing from the spirit and scope of the invention as defined by the appended claims.

What is claimed is:

1. A measuring device for measuring a signal of interest within a measuring signal, comprising:
   a trace determiner adapted to consecutively determine a first stack of traces of the measuring signal; and
   a statistics evaluator adapted to, after each trace of said first stack of traces is determined by the trace determiner, statistically evaluate if a presence of the signal of interest is detected with a first pre-set degree of certainty, wherein the statistical evaluation comprises determining signal of interest candidates as individual frequency bin values of a single trace of the first stack of traces exceeding at least one pre-set noise threshold; and
   wherein the trace determiner is adapted to cease determining said traces of said first stack of traces when the statistics evaluator has determined that the signal of interest has been detected to the first pre-set degree of certainty.

2. The measuring device of claim 1, further comprising:
   a parameter determiner adapted to determine measuring parameters based upon the statistical evaluation.

3. The measuring device of claim 2, further comprising:
   a receiver adapted to measure the signal of interest within the measuring signal based upon the parameters determined by the parameter determiner.

4. The measuring device of claim 2, wherein the parameter determiner is adapted to determine said measuring parameters based upon said degree of certainty, by which the presence of the signal of interest is determined by the statistics evaluator.

5. The measuring device of claim 2, wherein the measuring parameters comprise one or more of a center frequency, a frequency span, an amplitude, and a power of the signal of interest.

6. The measuring device of claim 1, wherein the statistics evaluator is adapted to perform said statistical evaluation by detecting signals statistically significant with regard to a noise floor.

7. The measuring device of claim 1, wherein the statistics evaluator is adapted so that the statistical evaluation comprises determining signal of interest candidate sets as sets of the frequency bin values of a same frequency over a plurality of consecutive traces exceeding the pre-set noise threshold.

8. The measuring device of claim 7, wherein the statistics evaluator is adapted so that the statistical evaluation comprises determining a frequency of occurrence of the signal of the interest candidate sets.

9. The measuring device of claim 1, wherein the statistics evaluator is adapted to determine if the signal of interest is pulsed.

10. The measuring device of claim 9, wherein the statistics evaluator is adapted so that said determining if the signal of interest is pulsed comprises determining how often the signal of interest occurs within said stack of traces.

11. The measuring device of claim 1, wherein, after the statistics evaluator has determined that the signal of interest has been detected to the pre-set degree of certainty, the trace determiner is adapted to determine a second stack of traces, wherein a span of the second stack of traces is a pre-set bandwidth around a span of the signal of interest determined by the statistics evaluator.

12. The measuring device of claim 11, wherein the statistics evaluator is adapted to, after each trace of said second stack of traces is determined by the trace determiner, statistically evaluate if a presence of the signal of interest is detected with a second pre-set degree of certainty, wherein the trace determiner is adapted to cease determining said traces of said second stack of traces when the statistics evaluator has determined that the signal of interest has been detected to the second pre-set degree of certainty.

13. The measuring device of claim 11, wherein the parameter determiner is adapted to determine the measuring parameters based upon the statistical evaluation of the first stack of traces and the second stack of traces.

14. The measuring device of claim 1, wherein the statistics evaluator is adapted to determine a reference noise level, to determine a peak level of the determined signal of interest, to determine a noise threshold between the reference noise level and the peak level of the determined signal of interest, and to perform the statistical analysis based upon said noise threshold.

15. The measuring device of claim 14, wherein the statistical evaluator is adapted to determine a repetition interval of the signal of interest from a time of the signal above the noise threshold and a time of the signal below the noise threshold.

16. The measuring device of claim 1, wherein the measuring device is adapted to indicate at least one type of measurement based upon the statistical evaluation by the statistical evaluator on a display.

17. A measuring method for measuring a signal of interest within a measuring signal, comprising the steps:
consecutively determining, by a trace determiner of a measuring device, a first stack of traces of the measuring signal;
after each trace of said first stack of traces is determined, statistically evaluating, by a statistics evaluator of the measuring device, if a presence of the signal of interest is detected with a first pre-set degree of certainty, wherein the statistical evaluation comprises determining one or more signal of interest candidates as individual frequency bin values of a single trace of the first stack of traces exceeding at least one pre-set noise threshold; and
ceasing determining said traces of said first stack of traces when it has been determined that the signal of interest has been detected to the first pre-set degree of certainty.

18. The measuring method of claim 17, further comprising the step:
determining measuring parameters based upon the statistical evaluation.

* * * * *